US012002813B2

(12) United States Patent
Cheng et al.

(10) Patent No.: US 12,002,813 B2
(45) Date of Patent: Jun. 4, 2024

(54) METHOD FOR FORMING SEMICONDUCTOR-ON-INSULATOR (SOI) SUBSTRATE BY CLEAVING A MULTILAYER STRUCTURE ALONG VOIDS TO SEPARATE A SUBSTRATE

(71) Applicant: TAIWAN SEMICONDUCTOR MANUFACTURING COMPANY LTD., Hsinchu (TW)

(72) Inventors: Yu-Hung Cheng, Tainan (TW); Ching I Li, Hsinchu (TW); Chia-Shiung Tsai, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 429 days.

(21) Appl. No.: 17/461,370

(22) Filed: Aug. 30, 2021

(65) Prior Publication Data
US 2023/0066574 A1 Mar. 2, 2023

(51) Int. Cl.
*H01L 27/12* (2006.01)
*H01L 21/306* (2006.01)
(Continued)

(52) U.S. Cl.
CPC .... *H01L 27/1207* (2013.01); *H01L 21/30604* (2013.01); *H01L 21/3086* (2013.01); *H01L 21/31051* (2013.01)

(58) Field of Classification Search
CPC ........... H01L 27/1207; H01L 21/76259; H01L 21/02002
See application file for complete search history.

(56) References Cited

U.S. PATENT DOCUMENTS

2006/0063352 A1* 3/2006 Barlocchi ........... H01L 21/3247
438/455
2018/0035934 A1 2/2018 Kiani et al.

FOREIGN PATENT DOCUMENTS

EP 1050901 A2 11/2000
JP 2004265914 A 9/2004

OTHER PUBLICATIONS

Yonehara, Takao, and Kiyofumi Sakaguchi. "Eltran®; Novel SOI Wafer Technology Eltran®; Novel SOI Wafer Technology.", 2001 (Year: 2001).*

(Continued)

*Primary Examiner* — Lex H Malsawma
*Assistant Examiner* — Bruce R. Smith
(74) *Attorney, Agent, or Firm* — WPAT LAW; Anthony King

(57) ABSTRACT

A method for forming an SOI substrate is provided. The method includes following operations. A recycle substrate is received. A first multilayered structure is formed on the recycle substrate. A trench is formed in the first multilayered structure. A lateral etching is performed to remove portions of sidewalls of the trench to form a recess in the first multilayered structure. The trench and the recess are sealed with an epitaxial layer, and a potential cracking interface is formed in the first multilayered structure. A second multilayered structure is formed over the first multilayered structure. The device layer of the recycle substrate is bonded to an insulator layer over an carrier substrate. The first multilayered structure is cleaved along the potential cracking interface to separate the recycle substrate from the second multilayered structure, the insulator layer and the carrier substrate. The device layer is exposed.

20 Claims, 14 Drawing Sheets

(51) Int. Cl.
*H01L 21/308* (2006.01)
*H01L 21/3105* (2006.01)

(56) References Cited

OTHER PUBLICATIONS

Orlowski, Marius, et al. "Si, SiGe, Ge, and III-V semiconductor nanomembranes and nanowires enabled by SiGe epitaxy." ECS Transactions 33.6 (2010): 777.
Yonehara, Takao, and Kiyofumi Sakaguchi. "Eltran®; Novel SOI Wafer Technology Eltran®; Novel SOI Wafer Technology."
U.S. Pat. No. 6605518 B1 is the US counterpart of EP 1050901 A2.
U.S. Pat. No. 7691725 B2 is the US counterpart of JP 2004265914 A.

\* cited by examiner

METHOD FOR FORMING SEMICONDUCTOR-ON-INSULATOR (SOI) SUBSTRATE BY CLEAVING A MULTILAYER STRUCTURE ALONG VOIDS TO SEPARATE A SUBSTRATE

BACKGROUND

Integrated circuits (ICs) are often formed on bulk semiconductor substrates. In recent years, semiconductor-on-insulator (SOI) substrates have emerged as an alternative to bulk semiconductor substrates. An SOI substrate may include a carrier or a bulk substrate, an insulator layer overlying the carrier substrate, and a device layer overlying the insulator layer. The SOI substrates have advantages of reduced parasite capacitance, reduced leakage current, reduced latch-up, and improved semiconductor device performance, such as lower power consumption and higher switching speed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarify of discussion.

DETAILED DESCRIPTION

Figure 1:
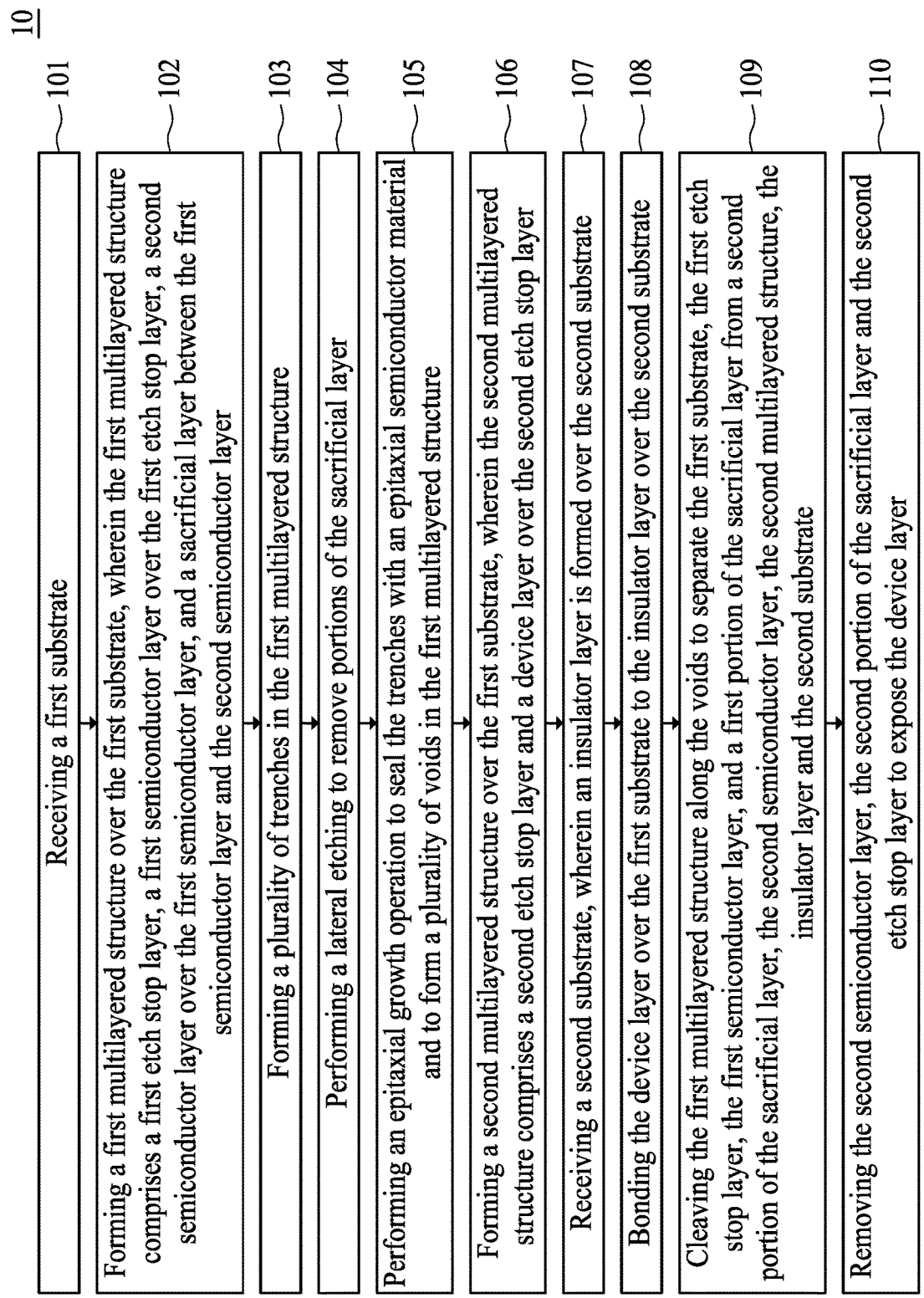
FIG. 1 shows a flowchart representing a method for forming an SOI substrate according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or features(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Many methods are developed to form an SOI substrate. For example, in some comparative approaches, a porous silicon layer is formed on a seed wafer or a sacrificial wafer, an epitaxial silicon layer overlying the porous silicon layer is formed, and an insulator layer overlying the epitaxial silicon layer is formed. After bonding the insulator layer to a handle substrate or a carrier wafer, a splitting operation can be performed to separate the epitaxial layer from the sacrificial wafer through the porous silicon layer by a mechanical force. Portions of the porous silicon layer remaining on the epitaxial silicon layer can be removed, and thus an SOI substrate including the carrier wafer, the insulator layer and the epitaxial silicon layer is obtained.

A challenge of the above-described method is related to the control of the splitting of the porous silicon layer. As mentioned above, the splitting is performed to separate the epitaxial silicon layer through the porous silicon layer. Further, the splitting is laterally performed on the porous silicon layer, and thus a rough surface of the porous silicon layer may be obtained because stresses generated from the splitting may extend in different directions in the porous silicon layer. The rough surface of the porous silicon layer makes the removal of the porous silicon layer from the epitaxial silicon layer more time-consuming and increases operation complexity. Further, the stress generated from the splitting may extend in different and unexpected directions. In some comparative approaches, the stress may even damage the device layer. For at least the above-mentioned reasons, the method may suffer from lower productivity.

The present disclosure therefore provides a method for forming an SOI substrate that includes a silicon germanium (SiGe) enhanced layer-transfer (SELAT) approach, with the introduction of the SiGe to help the separation of a device layer from a recycle substrate. In some embodiments, voids are formed in semiconductor layers to serve as break-away holes in the semiconductor layers. Consequently, a potential cracking interface can be formed by the break-away holes. Thus, the splitting or cleaving direction can be confined along the potential cracking interface. Accordingly, surface roughness can be reduced, and thus removal of the unnecessary layer can be simplified. Further, a recycling rate of a recycle wafer used in the method can be increased and thus operation cost can be reduced. In other words, the method for forming the SOI substrate is able to improve productivity and reduce cost.

FIG. 1 is a flowchart representing a method for forming an SOI substrate 10 according to aspects of the present disclosure. In some embodiments, the method for forming the SOI substrate 10 includes a number of operations (101, 102, 103, 104, 105, 106, 107, 108, 109 and 110). The method for forming the SOI substrate 10 will be further described according to one or more embodiments. It should be noted that the operations of the method 10 may be rearranged or otherwise modified within the scope of the various aspects. It should further be noted that additional processes may be provided before, during, and after the method 10, and that some other processes may just be briefly described herein. FIGS. 2, 3, 4, 5A, 6, 7A, 8, 9, 10, 11, 12, 13 and 14 are schematic drawings illustrating a series of cross-sectional views of some embodiments of a method for forming an SOI substrate according to aspects of the present disclosure in one or more embodiments. Further, FIG. 5B is a top view of FIG. 5A, and FIG. 7B is a perspective view of FIG. 7A according to aspects of the present disclosure.

Figure 2:
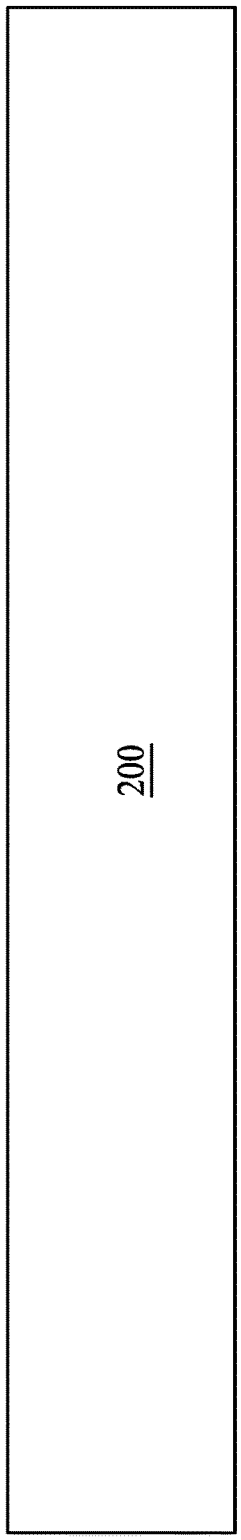
FIGS. 2, 3, 4, 5A, 6, 7A, 8, 9, 10, 11, 12, 13 and 14 are schematic drawings illustrating a series of cross-sectional views of some embodiments of a method for forming an SOI substrate according to aspects of the present disclosure in one or more embodiments.

Referring to FIG. 2, in operation 101, a first substrate 200 is received. In some embodiments, the first substrate 200 can be a bulk semiconductor substrate and/or a semiconductor wafer. In some embodiments, a thickness of the first substrate 200 can be between approximately 700 micrometers and approximately 800 micrometers. In some embodiments, the first substrate 200 can be referred to as a recycle substrate, which will be described in the following description.

Figure 3:
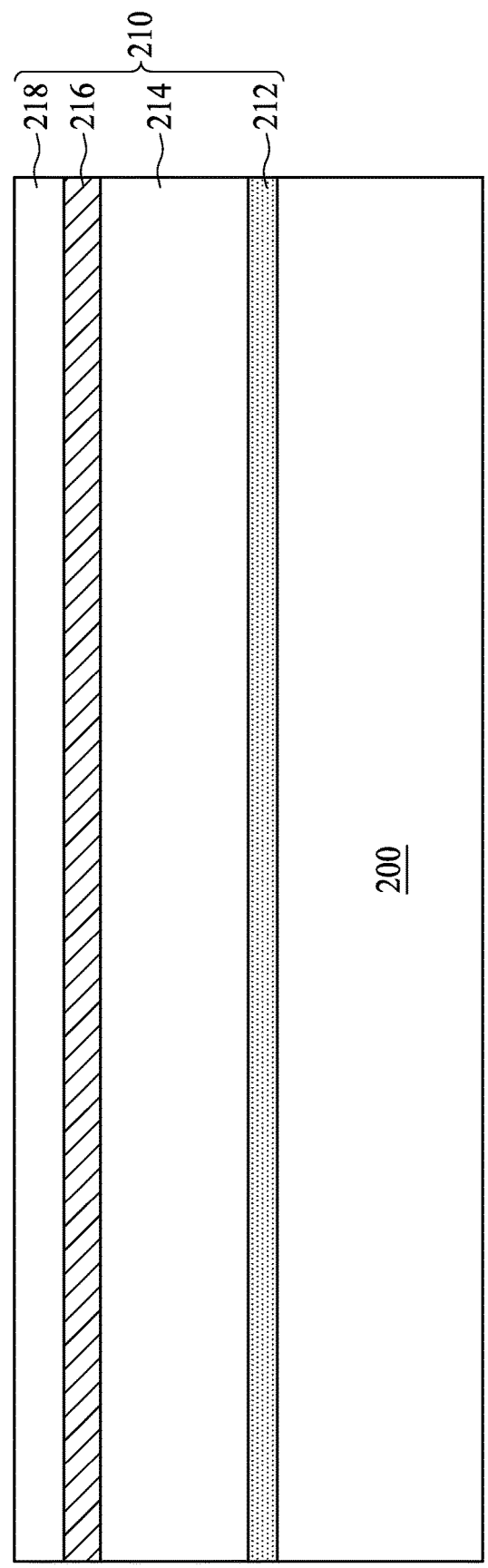

Referring to FIG. 3, in operation 102, a first multilayered structure 210 is formed over the first substrate 200. In some embodiments, the first multilayered structure 210 includes at least a semiconductor layer 212, a semiconductor layer 214, a semiconductor layer 216, and a semiconductor layer 218. In some embodiments, the four semiconductor layers 212 to 218 can be sequentially formed over the first substrate 200 by epitaxial growth operations. In some embodiments, the semiconductor layer 212 serves as an etch stop layer while the semiconductor layer 216 serves as a sacrificial layer, as described in the following description.

In some embodiments, the etch stop layer 212 of the first multilayered structure 210 includes a first semiconductor material and a second semiconductor material different from the first semiconductor material. In some embodiments, a crystalline lattice constant of the second semiconductor material is different from that of the first semiconductor material. For example, the crystalline lattice constant of the second semiconductor material can he greater than that of the first semiconductor material. In some embodiments, the first semiconductor material includes silicon (Si), and the second semiconductor material includes germanium (Ge). In such embodiments, the etch stop layer 212 can include SiGe. In some embodiments, a Ge concentration in the etch stop layer 212 can be between approximately 15% and approximately 35%, but the disclosure is not limited thereto. In some comparative approaches, when the Ge concentration is less than 15%, an etching selectivity between the etch stop layer 212 and the overlying layer (i.e., the semiconductor layer 214) is decreased such that the etch stop layer 212 may not be suitable for subsequent etching operations or removal operations. In some alternative comparative approaches, when the Ge concentration is greater than 35%, unwanted dislocation defect may occur between the etch stop layer 212 and the overlying semiconductor layer 214. In some embodiments, the etch stop layer 212 can include dopants to improve the etching selectivity. In some embodiments, the etch stop layer 212 can include boron (B). In some embodiments, a concentration of the dopants boron) in the etch stop layer 212 can be between approximately 1E20 ions/cm$^3$ and approximately 3E20 ions/cm$^3$, but the disclosure is not limited thereto. In some comparative approaches, when the B concentration is less than 1E20 ions/cm$^3$, the etching selectivity is decreased such that the etch stop layer 212 may not be suitable for etching operations or removal operations. In some alternative comparative approaches, when the B concentration is greater than 3E20 ions/cm$^3$, the epi quality of the layer 212 would become worse. In some embodiments, a thickness of the etch stop layer 212 is between approximately 10 nanometers and approximately 20 nanometers, but the disclosure is not limited thereto. In some comparative approaches, when the thickness of the etch stop layer 212 is less than approximately 10 nanometers, the etch stop layer 212 may he too thin to render suitable protection to the underlying layer (i.e. the first substrate 200). In some alternative comparative approaches, when the thickness of the etch stop layer 212 is greater than approximately 20 nanometers, more process time may be required during a removal operation.

Still referring to FIG. 3, in some embodiments, the semiconductor layer 214 of the first multilayered structure 210 includes the first semiconductor material, such as silicon. In some embodiments, a thickness of the semiconductor layer 214 can be between approximately 500 nanometers and approximately 1000 nanometers, but the disclosure is not limited thereto. In some comparative approaches, when the thickness of the semiconductor layer 214 is less than approximately 500 nanometers, the semiconductor layer 214 is too thin to accommodate a trench formed in subsequent operations, which will be described later. In some alternative comparative approaches, when the thickness of the semiconductor layer 214 is greater than 1000 nanometers, such thickness may cause extra cost in recycling operations, which will be described later.

Still referring to FIG. 3, in some embodiments, the sacrificial layer 216 of the first multilayered structure 210 includes the first semiconductor material and the second semiconductor material. For example, the sacrificial layer 216 includes SiGe. In some embodiments, a Ge concentration of the sacrificial layer 216 can be between approximately 10% and approximately 40%, but the disclosure is not limited thereto. In some comparative embodiments, when the Ge concentration of the sacrificial layer 216 is less than 10%, an etching selectivity between the sacrificial layer 216 and the underlying layer (i.e., the semiconductor layer 214) and an etching selectivity between the sacrificial layer 216 and the overlying layer (i.e., the semiconductor layer 218) are decreased such that the sacrificial layer 216 may not be suitable for subsequent etching operations. In some alternative comparative approaches, when the Ge concentration is greater than 45%, unwanted dislocation defect may occur between the sacrificial layer 216 and the overlying semiconductor layer 218. A thickness of the sacrificial layer 216 is between approximately 10 nanometers and approximately 20 nanometers, but the disclosure is not limited thereto.

Additionally, in some embodiments, the sacrificial layer 216 can include the first semiconductor material, the second semiconductor material and the dopants. For example, the sacrificial layer 216 can include SiGe doped with B. A boron concentration in the sacrificial layer 216 can be similar to that in the etch stop layer 212; therefore, repeated description of such details are omitted in the interest of brevity.

Still referring to FIG. 3, in sonic embodiments, the semiconductor layer 218 of the first multilayered structure 210 includes the first semiconductor material, such as silicon. A thickness of the semiconductor layer 218 can be less than the thickness of the semiconductor layer 214. In some embodiments, the thickness of the semiconductor layer 218 can be between approximately 200 nanometers and approximately 400 nanometers, but the disclosure is not limited thereto. In some embodiments, the thickness of the semiconductor layer 214 and the thickness of the semiconductor layer 218 are greater than the thickness of the etch stop layer 212 and the thickness of the sacrificial layer 216.

Figure 4:
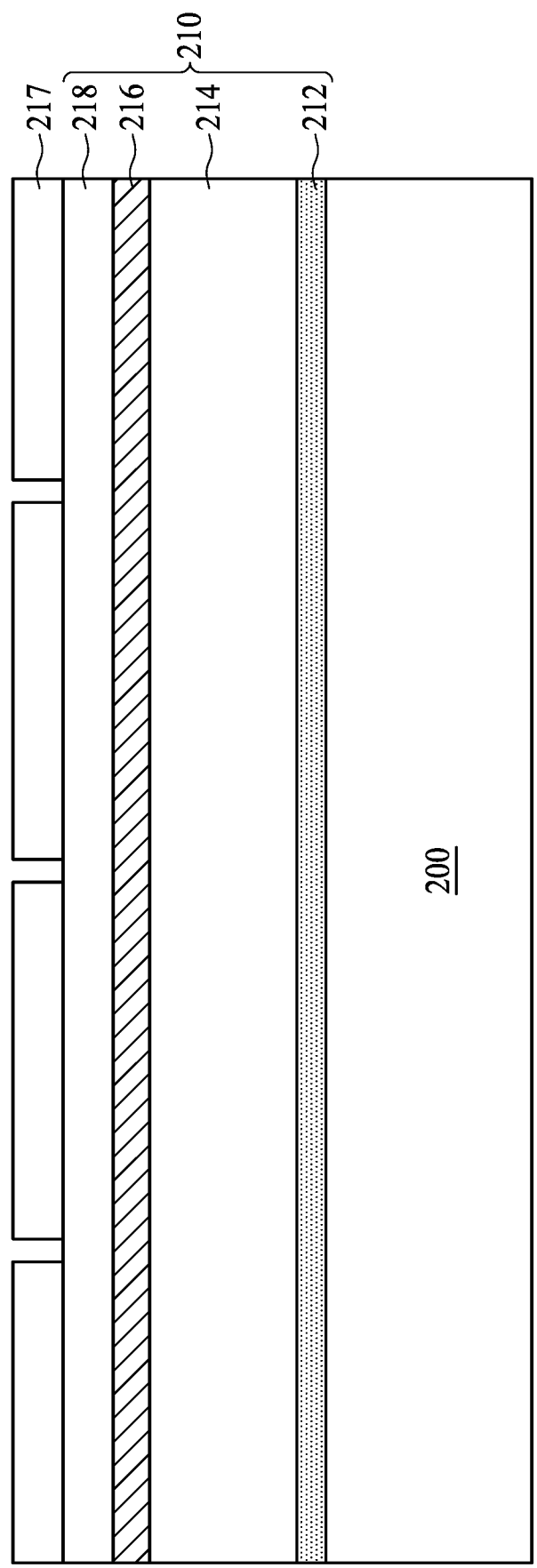
Figure 5A:
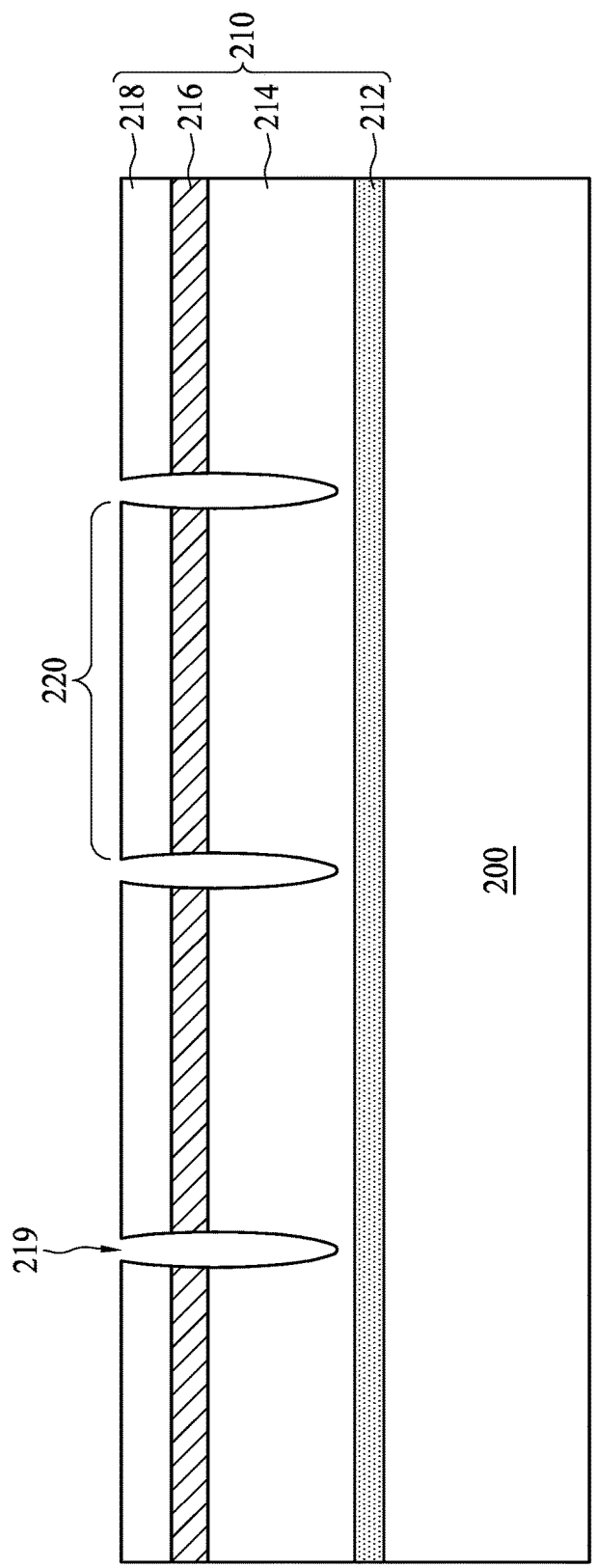
Figure 5B:
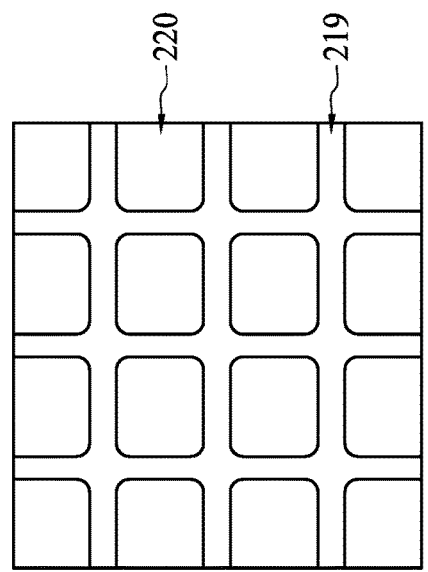
FIG. 5B is a top view of FIG. 5A.

Referring to FIGS. 4, 5A and 5B, in operation 103, a plurality of trenches 219 are formed in the first multilayered structure 210. In some embodiments, a patterned mask layer 217 can be formed over the first multilayered structure using a photolithography operation. The patterned mask layer 217 is used to form the trenches 219 and define a width and locations of the trenches 219. In some embodiments, an etching operation can be performed to remove portions of the semiconductor layer 214, the sacrificial layer 216 and the semiconductor layer 218. In some embodiments, the etching operation includes a dry etching. Thus, a plurality of trenches 219 and a plurality of mesas 220 are obtained as shown in FIGS. 5A and 5B. In some embodiments, a depth of the trenches 219 is less than a sum of the thickness of the semiconductor layer 214, the thickness of the sacrificial layer 216 and the thickness of the semiconductor layer 218. For example, the depth of the trenches 219 can be between approximately 0.5 micrometers and approximately 10 micrometers, but the disclosure is not limited thereto. In some embodiments, a width of the trenches 219 can be between approximately 50 nanometers and approximately 100 nanometers, but the disclosure is not limited thereto. In some embodiments, a depth-to-width aspect ratio of the trenches 219 can be greater than 10:1, but the disclosure is not limited thereto. In such embodiments, the trenches 219 can be referred to as deep trenches.

In some embodiments, the trenches 219 are arranged to have a grid pattern such that the mesa 220 are separated from each other by the trenches 219, as shown in FIG. 5B, but the disclosure is not limited thereto. In some embodiments, a width of the mesas 220 is greater than the width of the trenches 219. For example, the width of the mesas 220 can be between approximately 0.5 micrometers and approximately 2.0 micrometers, but the disclosure is not limited thereto. In some embodiments, a density of the mesas 220 over the first substrate 200 can be greater than approximately $2E8\ cm^{-2}$, but the disclosure is not limited thereto.

Referring to FIG. 5A, in some embodiments, the semiconductor layer 214, the sacrificial layer 216 and the semiconductor layer 218 are exposed through sidewalls of the trenches 219. However, the etch stop layer 212 is separated from a bottom of the trench 219 by the semiconductor layer 214. In some comparative approaches, when the etch stop layer 212 is exposed through the trenches 219, such exposure may cause extra cost in recycling operations, which will be discussed in following description.

Figure 6:
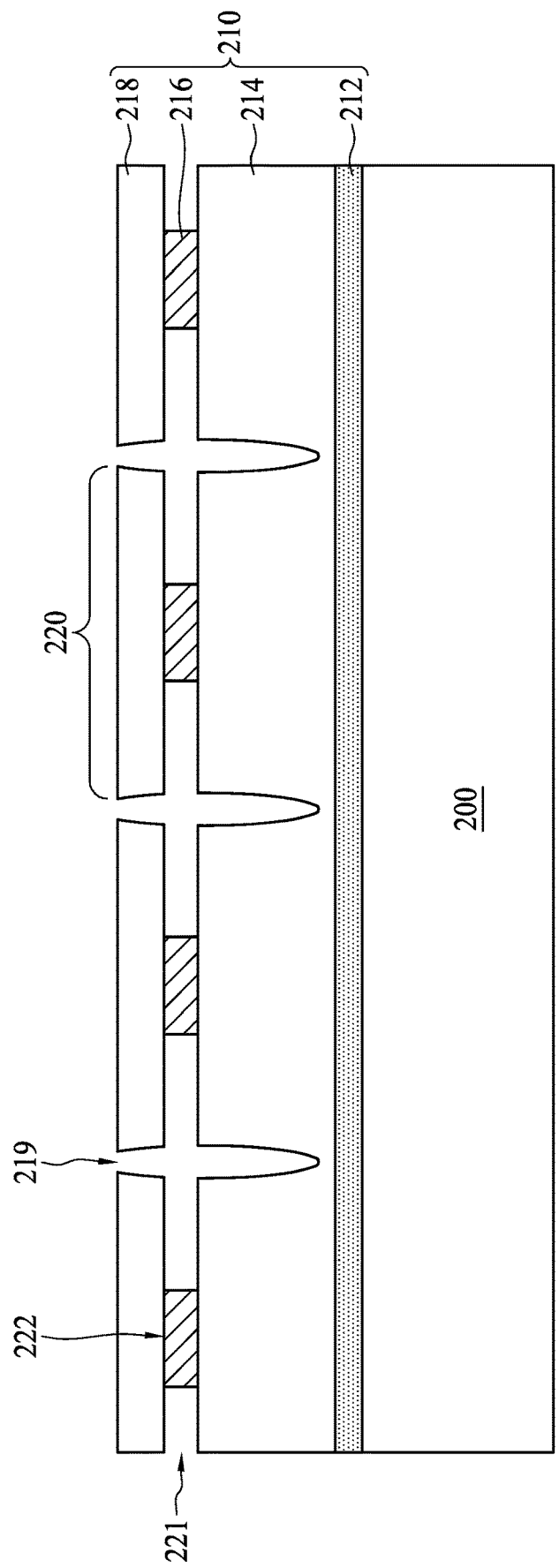

Referring to FIG. 6, in operation 104, a lateral etching is performed to remove portions of the sacrificial layer 216. In some embodiments, the lateral etching is performed to remove portions of the sacrificial layer 216 exposed through sidewalk of the trenches 219 to form a recess 221 in the first multilayered structure 210. As shown in FIG. 6, the recess 221 extends laterally in the sacrificial layer 216. In other words, the lateral etching is performed to remove a portion of the sacrificial layer 216 to form an island 222 within each mesa 220. As shown in FIG. 6, the trenches 219 are coupled to the recesses 221. In some embodiments, the trenches 219 extend along a first direction while the recesses 221 extend along a second direction different from the first direction. In some embodiments, the first direction is perpendicular to a surface of the first substrate 200, and the second direction is parallel to the surface of the first substrate 200. In some embodiments, the lateral etching can include a chemical plasma etching using pure carbon tetrafluoride ($CF_4$) as the etching gas in a downstream plasma reactor. In some embodiments, the lateral etching can include a hydrochloric acid (HCl) etching. In other embodiments, the lateral etching can include a wet etching using a compound including hydrogen fluoride (HF), nitric acid ($HNO_3$), and acetic acid ($CH_3COOH$) (HNA). However, the lateral etching can include any other suitable compound that has an etching selectivity between the sacrificial layer 216 and the underlying/overlying layers, such as the semiconductor layers 214 and 218.

Figure 7A:
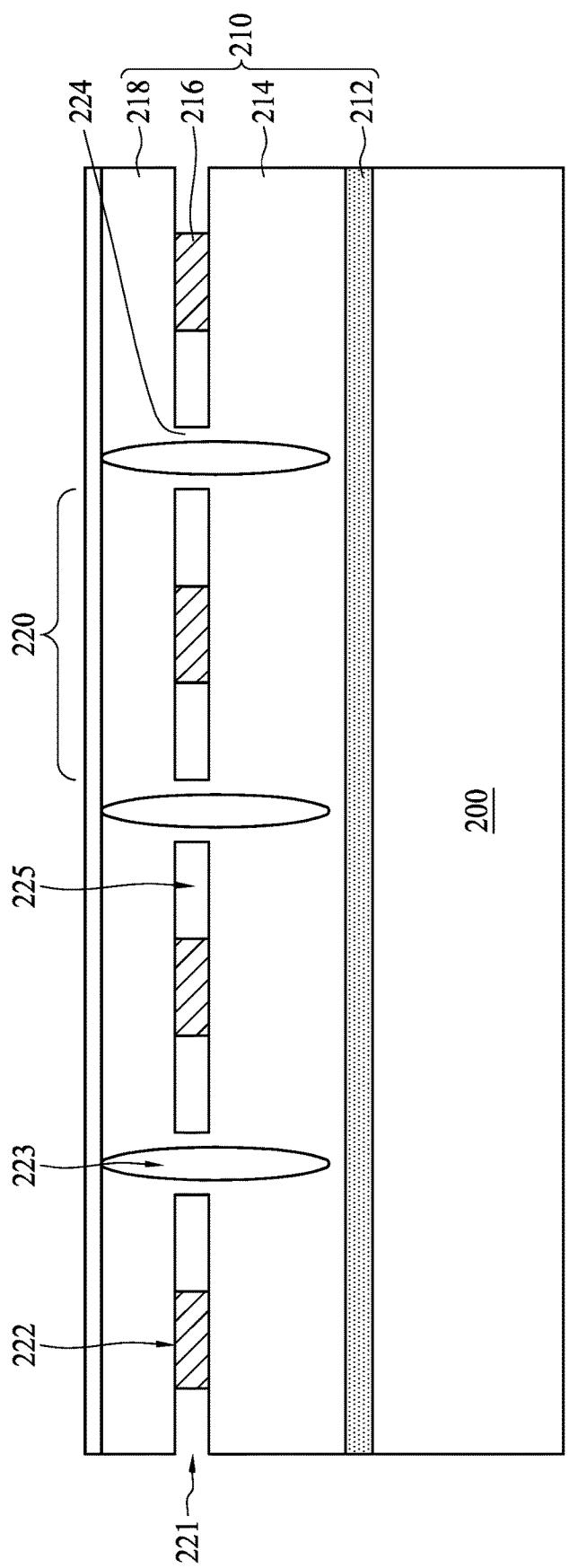
Figure 7B:
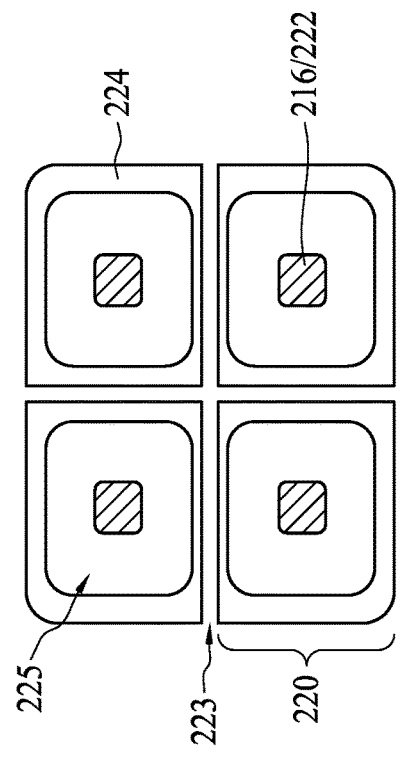
FIG. 7B is a perspective view of FIG. 7A according to aspects of the present disclosure.

Referring to FIGS. 7A and 7B. in operation 105, an epitaxial growth operation is performed to seal the trenches 219 with an epitaxial semiconductor material 224 and form a plurality of voids 223 and 225 in the first multilayered structure 210. Further, the recesses 221 are concurrently sealed. In some embodiments, the epitaxial semiconductor material 224 can be similar to that of the semiconductor layer 214 or 218. For example, the epitaxial semiconductor material 224 can include silicon. During the operation, the epitaxial semiconductor material 224 is grown along silicon surfaces that are exposed through the sidewalls and bottoms of the trenches 219. In some embodiments, because the aspect ratio of the trenches 219 is greater than 10:1, the trenches 219 and the recesses 221 are easily sealed by the epitaxial semiconductor material 224 before being filled up. Accordingly, the voids 223 and 225 are formed in the first multilayered structure 210, as shown in FIGS. 7A and 7B.

Referring to FIG. 7A, the epitaxial semiconductor material 224 forms sidewalls, a bottom and a top of each of the voids 223. Different from the voids 223, the voids 225 have sidewalls formed of the epitaxial semiconductor material 224 and the sacrificial layer 216, a bottom formed of the semiconductor layer 214, and a top formed of the epitaxial semiconductor material 224. Referring to FIG. 7B, the voids 223 are between mesas 220 and extend along the first direction perpendicular to the surface of the first substrate 200. Different from the voids 223, each void 225 is within a mesa 220 and extend along the second direction parallel to the surface of the first substrate 200. Further, each island 222 is surrounded by one void 225. The density of the voids 223 and 225 in a plane where the voids 223 and 225 are both observed may be measured as a porosity. In some embodiments, the porosity can be greater than approximately 60%.

Figure 8:
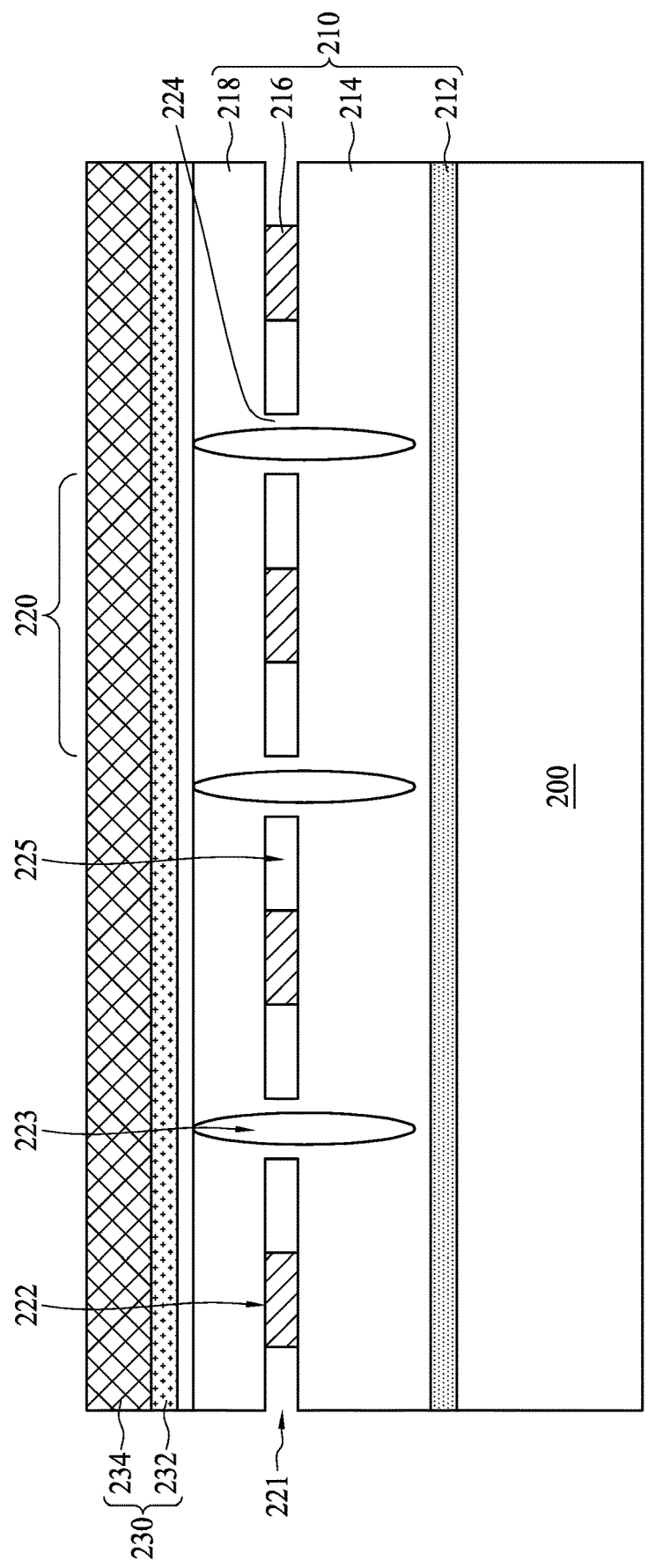

Referring to FIG. 8, in operation 106, a second multilayered structure 230 is formed over the first substrate 200 or the first multilayered structure 210. Additionally, the second multilayered structure 230 is formed over the epitaxial semiconductor material 224. In some embodiments, the second multilayered structure 230 includes an etch stop layer 232 and a device layer 234. As shown in FIG. 8, the etch stop layer 232 is between the device layer 234 and the epitaxial semiconductor material 224. In some embodiments, both the etch stop layer 232 and the device layer 234 can be formed by an epitaxial growth operation, In some embodiments, the etch stop layer 232 of the second multilayered structure 230 includes the first semiconductor material and the second semiconductor material. For example, the etch stop layer 232 can include SiGe. In some embodiments, a Ge concentration in the etch stop layer 232 can be between approximately 15% and approximately 35%, but the disclosure is not limited thereto. In some comparative approaches, when the Ge concentration is less than 15%, an etching selectivity between the etch top layer 232 and the overlying layer (i.e., the device layer 234) is decreased such that the etch stop layer 232 may not be suitable for subsequent etching operations or removal operations. In some alternative comparative approaches, when the Ge concentration is greater than 35%, unwanted dislocation defect may occur between the etch stop layer 232 and the overlying semiconductor layer (i.e., the device layer 234). In some embodiments, the etch stop layer 232 can include dopants to improve the etching selectivity. In some embodiments, the etch stop layer 232 include boron. In some embodiments, a concentration of the dopants (i.e., boron) in the etch stop layer 232 can be between approximately 1E20 ions/cm$^3$ and approximately 3E20 ions/cm$^3$, but the disclosure is not limited thereto. In some comparative approaches, when the B concentration is less than 1E20 ions/cm$^3$, the etching selectivity is decreased such that the etch stop layer 232 may not be suitable for following etching operations or removal operations. In some alternative comparative approaches, when the B concentration is greater than 3E20 ions/cm$^3$, the epi quality of the etch stop layer 232 would become worse. In some embodiments, a thickness of the etch stop layer 232 is between approximately 10 nanometers and approximately 20 nanometers, but the disclosure is not limited thereto. In some comparative approaches, when the thickness of the etch stop layer 232 is less than approximately 10 nanometers, the etch stop layer 232 may be too thin to render suitable protection to the underlying layers. In some alternative comparative approaches, when the thickness of the etch stop layer 232 is greater than approximately 20 nanometers, the epi quality of the etch stop layer 232 would become worse.

Still referring to FIG. 8, in some embodiments, the device layer 234 of the second multilayered structure 230 can include the first semiconductor material such as silicon. The device layer 234 may, for example, support or accommodate semiconductor devices, interconnect structures, doped regions, and/or isolation structures. A thickness of the device layer 234 is between approximately 10 nanometers and approximately 200 nanometers, but the disclosure is not limited thereto. It should be noted that the thickness of the device layer 234 is determined by the elements to be formed in or over the device layer 234.

Figure 9:
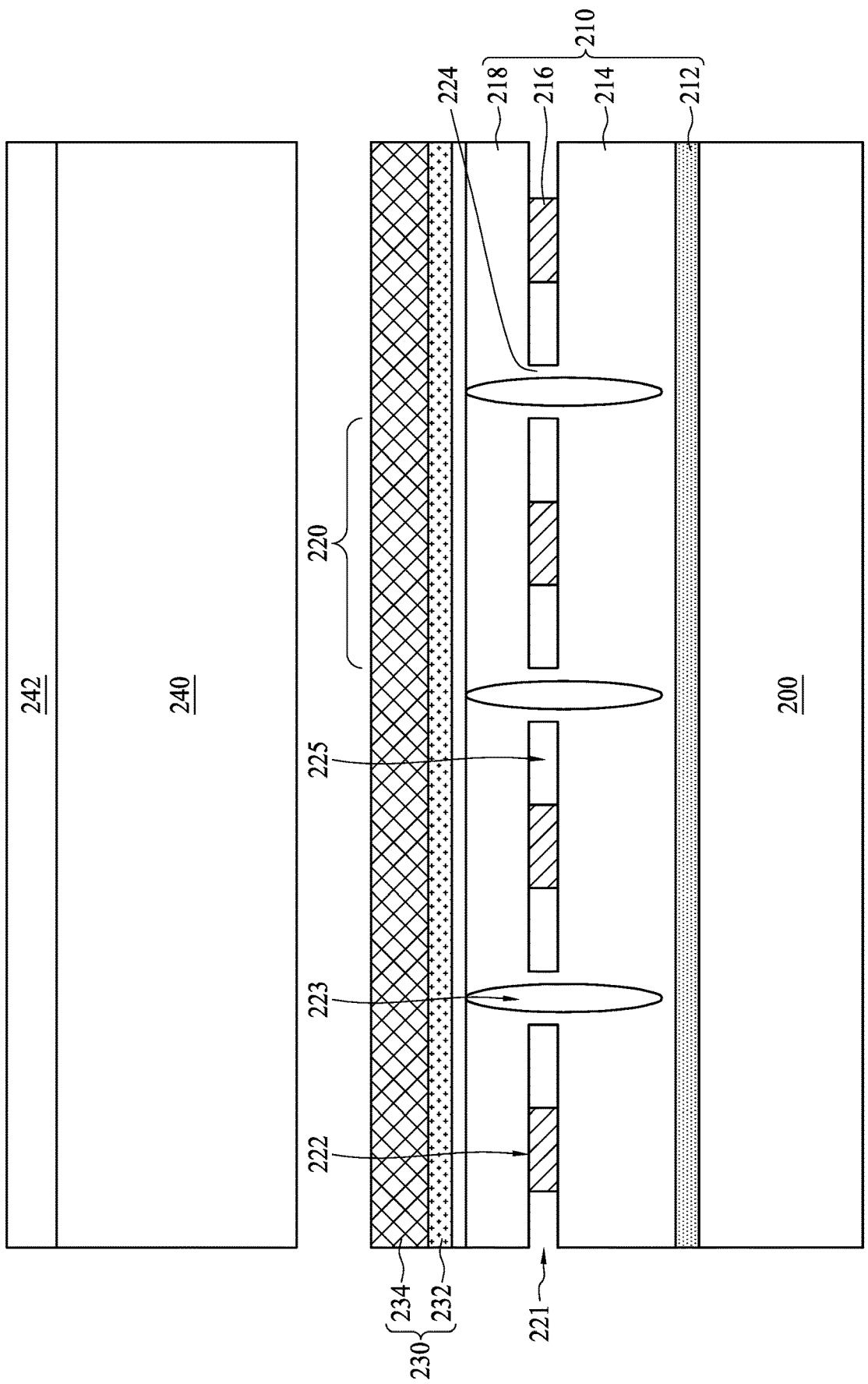

Referring to FIG. 9, in operation 107, a second substrate 240 is received. In some embodiments, the second substrate 240 can be a bulk semiconductor substrate and/or a semiconductor wafer. In some embodiments, the second substrate 240 can be referred to as a carrier substrate or a handle substrate. An insulator layer 242 can be formed over the second substrate 240. The insulator layer 242 overlying the second substrate 240 can include silicon oxide, silicon-rich oxide (SRO), another oxide, silicon carbide, silicon nitride, another dielectric, or any combination of the foregoing. A thickness of the insulator layer 242 can be various as long as it provides suitable electrical insulation between the second substrate 240 and an overlying layer.

Figure 10:
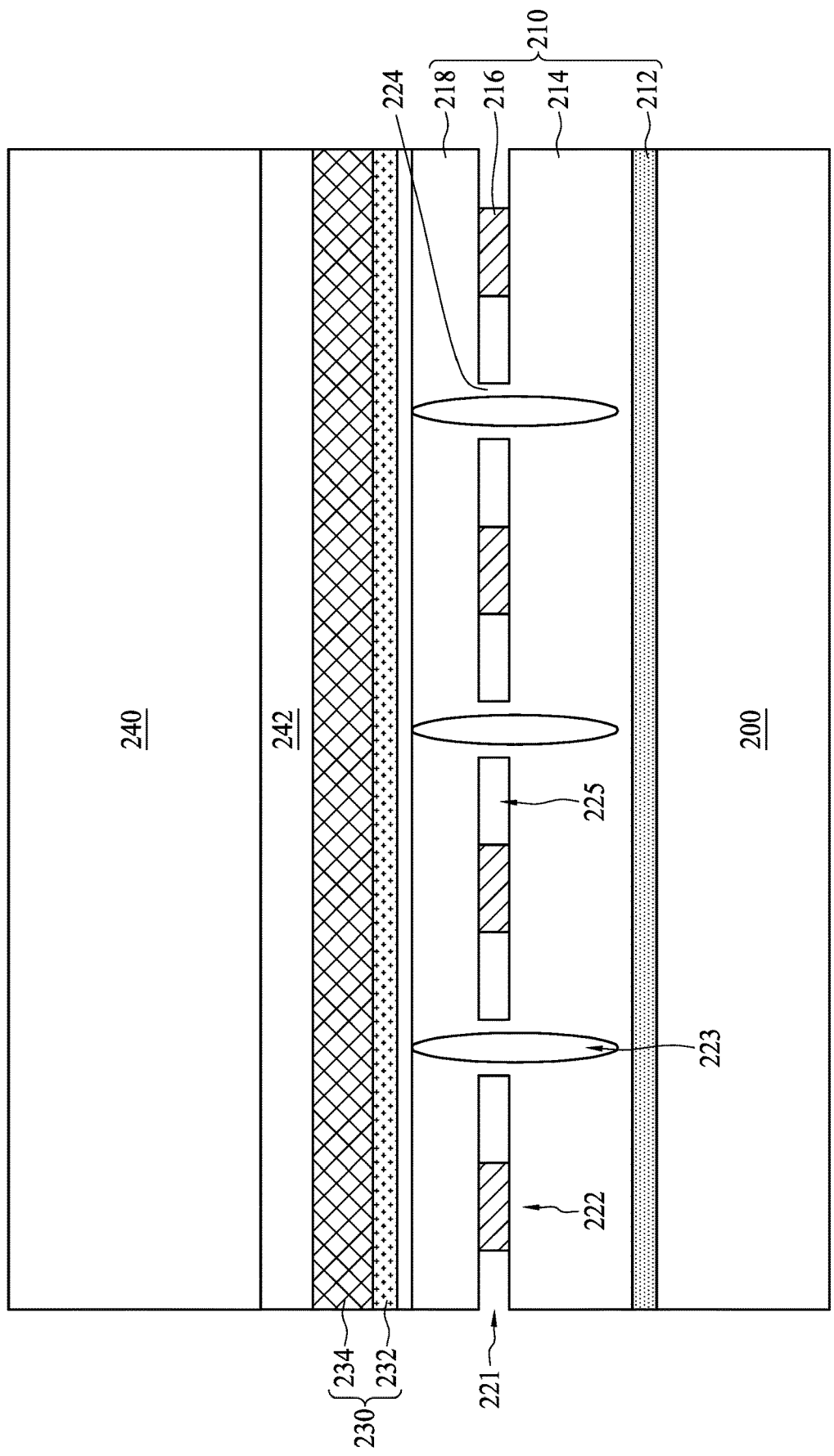

Referring to FIG. 10, in operation 108, the device layer 234 over the first substrate 200 is bonded to the insulator layer 242 over the second substrate 240. In some embodiments, the second substrate 240 can be flipped over such that the insulator layer 242 can be bonded to the device layer 234. In some embodiments, the bonding can be performed by a fusion bonding, a vacuum bonding or another bonding operation.

Figure 11:
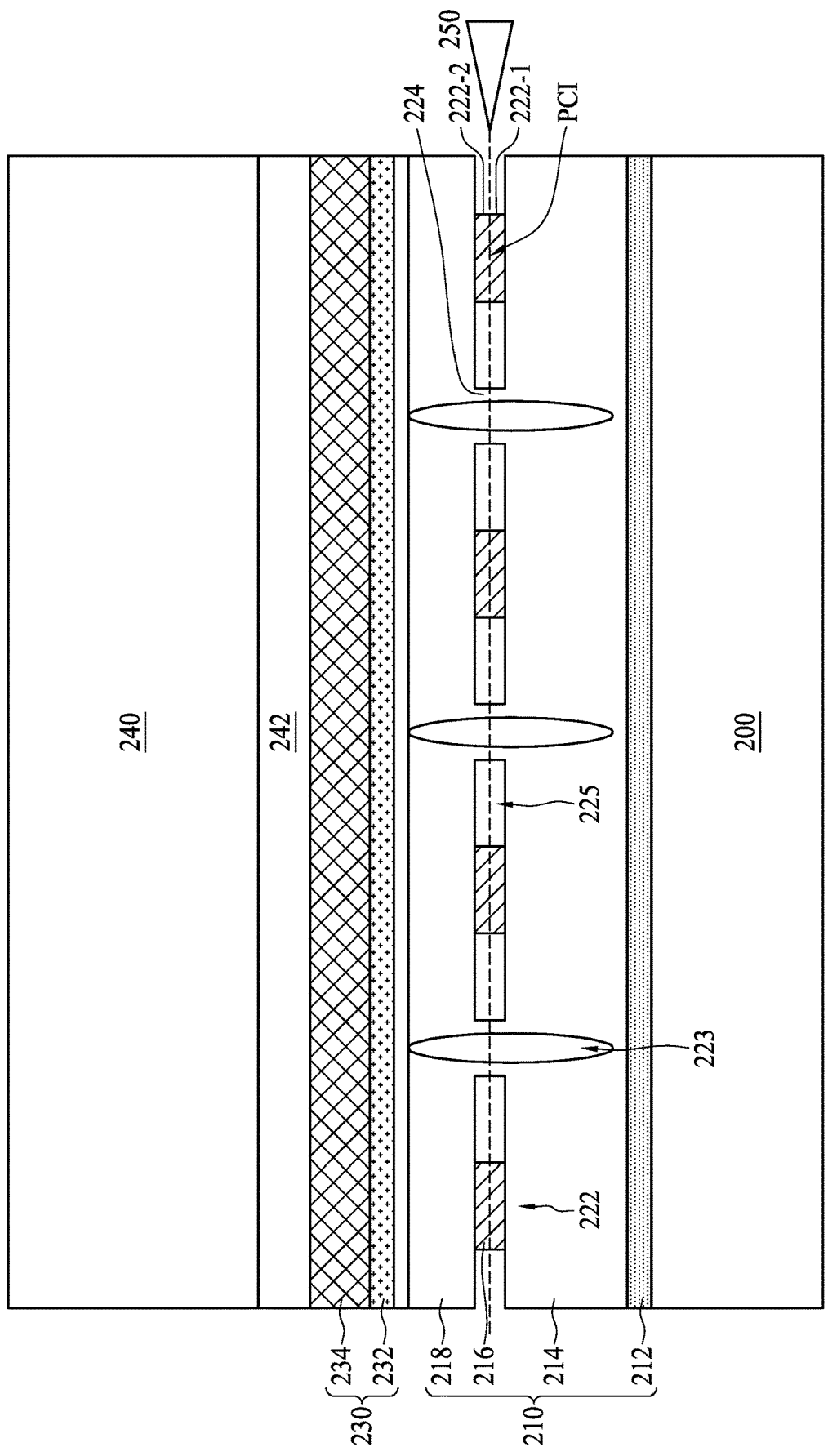

Referring to FIG. 11, in operation 109, the first multilayered structure 210 is cleaved along the voids 223 and 225 to separate the first substrate 200, the etch stop layer 212, the first semiconductor layer 214, and a first portion 222-1 (shown in FIG. 15) of the sacrificial layer 216 from a second portion 222-2 (shown in FIG. 12) of the sacrificial layer 216, the second semiconductor layer 218, the second multilayered structure 230, the insulator layer 242 and the second substrate 240. A cleaving apparatus can be used to cleave the first multilayered structure 210. In some embodiments, the cleaving apparatus can include a solid wedge. In other embodiments, the cleaving apparatus can include a fluid wedge, such as a water jet. In some embodiments, because the porosity of the voids 223 and 225 is greater than approximately 60%, the voids 223 and 225 serve as breakaway holes in the first multilayered structure 210 and a potential cracking interface PCI can be formed by the break-away holes. During the cleaving, the cleaving wedge may aim the potential cracking interface PCI or may aim the islands 222. In some embodiments, stress from the cleaving apparatus may extend into the first multilayered structure 210 along the potential cracking interface PCI. Further, the cleaving stress can be confined in the potential cracking interlace PCI.

As shown in FIG. 11, in some embodiments, a portion of the island 222 closer to the first semiconductor layer 214 of the first multilayered structure 210 can be referred to as a first portion 222-1 of the sacrificial layer 216 or a first portion 222-1 of the island 222, while a portion of the island 222 closer to the second multilayered structure 230 can be referred to as a second portion 222-2 of the sacrificial layer 216 or a second portion 222-2 of the island 222, after the cleaving. In some embodiments, a thickness of the first portion 222-1 and a thickness of the second portion 222-2 may be similar. In some embodiments, the thickness of the first portion 222-1 and the thickness of the second portion 222-2 may be different. In some embodiments, the thicknesses of the first portions 222-1 of different islands 222 may vary, and the thicknesses of the second portions 222-2 of different islands 222 may also vary due to the cleaving stress.

Figure 12:
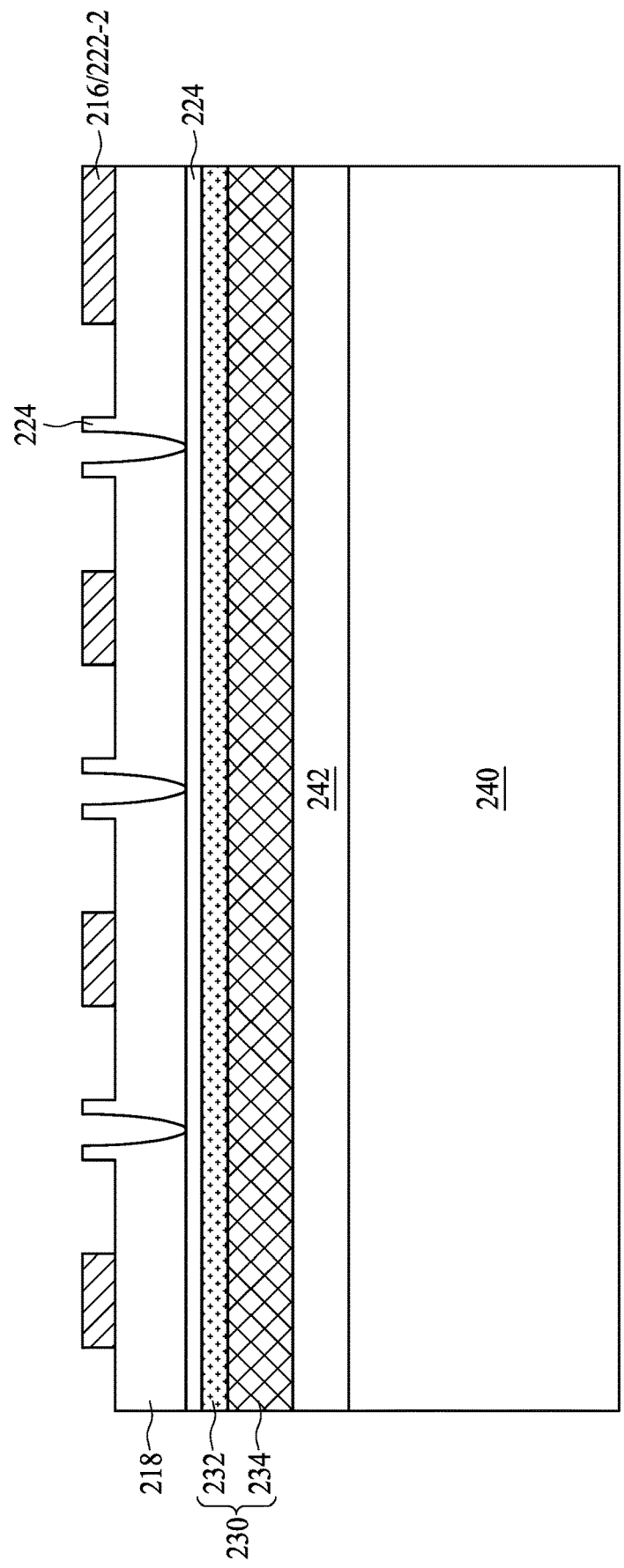

Referring to FIG. 12, after the cleaving, the second substrate 240, the insulator layer 242, the second multilayered structure 230, the second semiconductor layer 218 and the second portion 222-2 of the sacrificial layer 216 are flipped over, in some embodiments, the second portion 222-2 of the sacrificial layer 216 and portions of the epitaxial semiconductor material 224 may protrude from a surface of the second semiconductor layer 218, as shown in FIG. 12.

Figure 13:
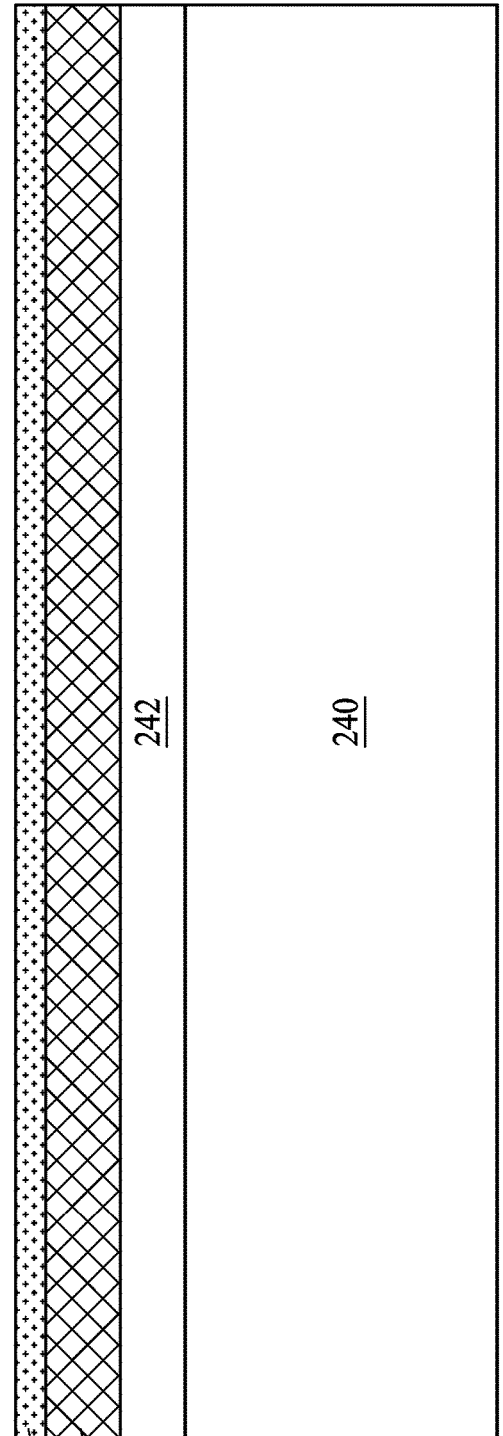
Figure 14:
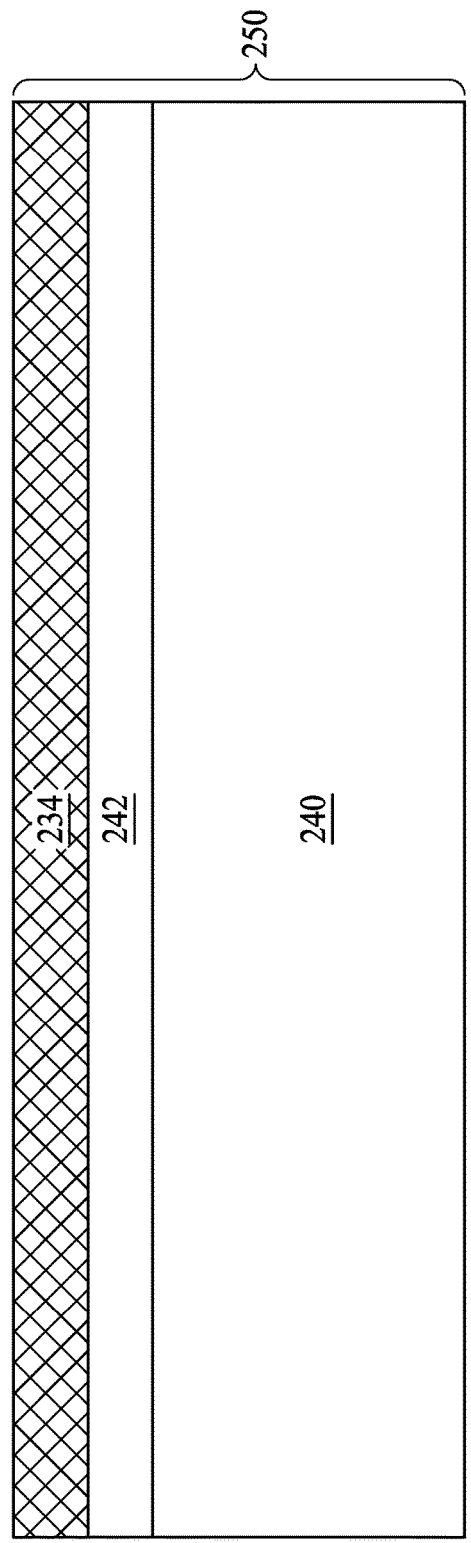

Referring to FIGS. 13 and 14, in operation 110, the second semiconductor layer 218, the second portion 222-2 of the sacrificial layer 216, the epitaxial semiconductor material 224, and the etch stop layer 232 are removed to expose the device layer 234. In some embodiments, an etching operation is performed to remove the second semiconductor layer 218, the second portion 222-2 of the sacrificial layer 216, and the epitaxial semiconductor material 224. In some embodiments, the etching operation includes a wet etching. In some embodiments, the wet etching uses tetramethyl ammonium hydroxide (TMAH), but the disclosure is not limited thereto. An etching rate of TMAH on the etch stop layer 232 may be less than 10 angstrom/min. As mentioned above, the etch stop layer 232 includes silicon germanium doped with boron. Because the Ge concentration is greater than approximately 15% and the B concentration is greater than approximately 1E20 ions/cm$^3$, an etching ratio between the etch stop layer 232 and other layers (i.e., the second semiconductor layer 218, the sacrificial layer 216 and the epitaxial semiconductor material 224) is less than 1:100. Therefore, the device layer 234 underlying the etch stop layer 232 can be protected from the etching operation during removal of the layers overlying the etch stop layer 232. Accordingly, the etch stop layer 232 is exposed after the etching operation, as shown in FIG. 13. Additionally, etchants having an etching rate on the etch stop layer 232 equal to or less than 10 angstrom/min can be used.

Referring to FIG. 14, in operation 110, the etch stop layer 232 is removed to expose the device layer 234. In sonic embodiments, the removal of the etch stop layer 232 can include a planarization operation. In other embodiments, the removal of the etch stop layer 232 can include an etching operation. Consequently, an SOI substrate 250 including the second substrate 240, the insulator layer 242 and the device layer 234 is obtained. Additionally, the second substrate 240 supporting the insulator layer 242 and the device layer 234 can be referred to as a carrier substrate.

In some embodiments, an anneal can be performed. The anneal may reduce dislocation defect and thus smooth a surface of the device layer 234. In some embodiments, a temperature of the anneal may be greater than approximately 1000° C., and a duration of the anneal may be longer than approximately 2 hours, but the disclosure is not limited thereto.

Figure 15:
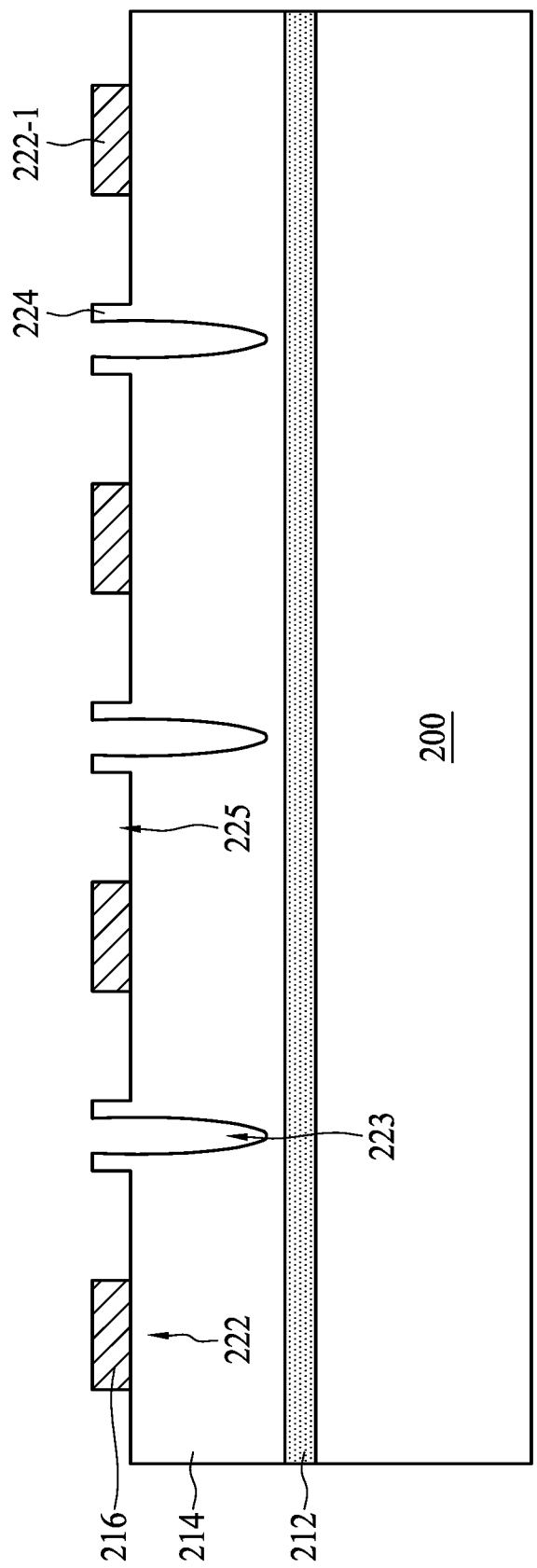
FIGS. 15, 16 and 17 are schematic drawings illustrating a series of cross-sectional views of some embodiments of a method for forming an SOT substrate according to aspects of the present disclosure in one or more embodiments.
Figure 16:
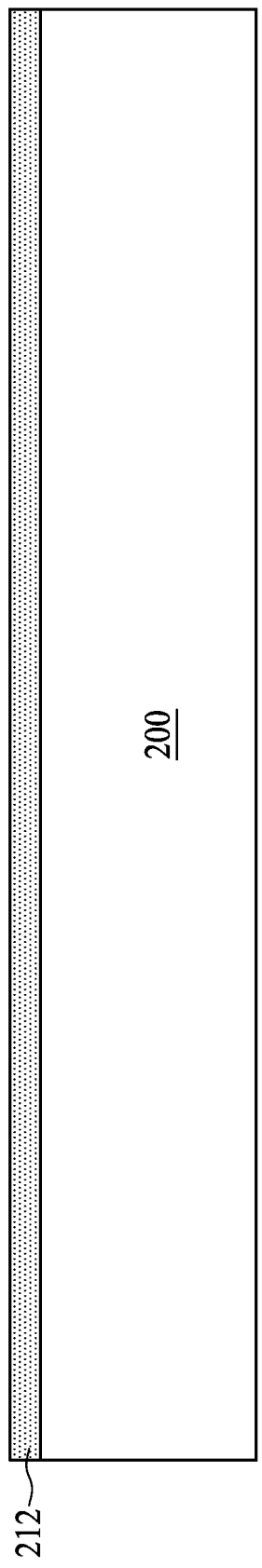
Figure 17:
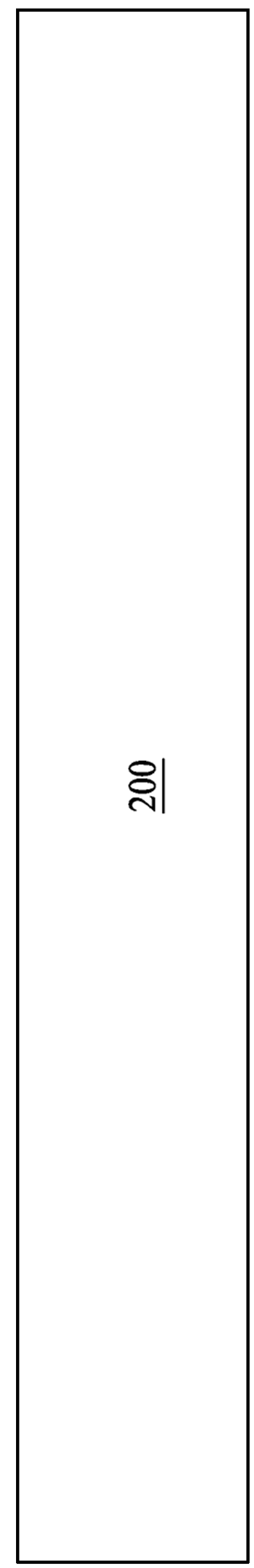

Referring to FIGS. 15 to 17, in some embodiments, recycling operations can he performed on the first substrate 200, the etch stop layer 212, the semiconductor layer 214, portions of the epitaxial semiconductor material 224 and the first portion 222-1 of the sacrificial layer 216 (as shown in FIG. 15) that are separated from the abovementioned layers.

Referring to FIG. 16, in some embodiments, an etching operation can be performed to remove the first portion 222-1 of the sacrificial layer 216, the epitaxial semiconductor material 224 and the semiconductor layer 214. In some embodiments, the etching operation includes a wet etching. In some embodiments, the wet etching uses TMAH, but the disclosure is not limited thereto. As mentioned above, an etching rate of TMAH on the etch stop layer 212 may be less than 10 angstrom/min. As also as mentioned above, the etch stop layer 212 includes silicon germanium doped with boron. Because the Ge concentration is greater than approximately 15% and the B concentration is greater than approximately 1E20 ions/cm$^3$, an etching ratio between the etch stop layer 212 and other layers (i.e., the semiconductor layer 214, the sacrificial layer 216 and the epitaxial semiconductor material 224) is less than 1:100. Therefore, the first substrate 200 underlying the etch stop layer 212 can be protected from the etching operation during removal of the layers overlying the etch stop layer 212. Accordingly, the etch stop layer 212 is exposed after the etching operation, as shown in FIG. 16. Additionally, etchants having an etching rate on the etch stop layer 212 equal to or less than 10 angstrom min can be used.

Referring to FIG. 17, the etch stop layer 212 is removed to expose the first substrate 200. In some embodiments, the removal of the etch stop layer 212 can include a planarization operation. In other embodiments, the removal of the etch stop layer 212 can include an etching operation. Consequently, the first substrate 200 can be used again after the recycling operations. For example, another first multilayered structure 210 can be formed over the first substrate 200 in order to manufacture another SOI substrate. Additionally, the first substrate 200 is therefore referred to as a recycle substrate.

It should be noted that according to the method, the device layer 234 can be formed by the epitaxial growth operation. Because the epitaxial growth operation is not subject to the thickness restrictions associated with other approaches for forming the device layer 234 (e.g., approaches that forms the device layer using ion implantation), the device layer 234 can be formed with various thicknesses. Further, because device layer 234 is bonded to the insulator layer 242, the forming of the device layer 234 is not affected by the thickness of the insulator layer 242. Thus, the insulator layer 242 may be formed with various thicknesses.

According to the method for forming the SOI substrate, the first multilayered structure including the epitaxially-grown semiconductor layers is provided. In the first multilayered structure, the semiconductor layer including SiGe and B serves as the etch stop layer, while the semiconductor layer including SiGe serves as a sacrificial layer. The trenches and recesses are formed in a location provided by the first multilayered structure. The method further provides an epitaxial semiconductor layer to seal the trenches and the recesses, and thus voids are obtained. Further, a second multilayered structure including the epitaxially-grown semiconductor layer is provided. In the second multilayered structure, the semiconductor layer including SiGe with B also serves as an etch stop layer while the semiconductor layer including Si serves as a device layer. As mentioned above, the porosity of the voids makes a potential cracking interface. Thus, stress induced in the cleaving of the second substrate, the insulator layer and the device layer from the first substrate can be confined along the cracking interface. Additionally, surface roughness can be reduced, thus helping to simplify subsequent removal and/or recycling operations. Further, the etch stop layers provide suitable protection during the removal of the overlying layers. Accordingly, the device layer is protected by the etch stop layer, and the device layer is thus being suitably prepared for subsequent semiconductor manufacturing operations. The recycle substrate can be protected by the etch stop layer, and thus consumption of the recycle substrate can be reduced, a recycling rate can be increased and operation cost can be reduced.

In some embodiments, a method for forming SOI substrate is provided. The method includes following operations. A first substrate is received. A first multilayered structure is formed over the first substrate. In some embodiments, the first multilayered structure includes a first etch stop layer, a first semiconductor layer over the first etch stop layer, a second semiconductor layer over the first semiconductor layer, and a sacrificial layer between the first semiconductor layer and the second semiconductor layer. A plurality of trenches are formed in the first multilayered structure. In some embodiments, the first semiconductor layer, the second semiconductor layer and the sacrificial layer are exposed through sidewalk of the trenches. A lateral etching is performed to remove portions of the sacrificial layer. An epitaxial growth operation is performed to seal the trenches with a first semiconductor material, and a plurality of voids are formed in the first multilayered structure. A second multilayered structure is formed over the first substrate. In some embodiments, the second multilayered structure includes a second etch stop layer and a device layer over the second etch stop layer. A second substrate is received. In some embodiments, an insulator layer is formed over the second substrate. The device layer over the first substrate is bonded to the insulator layer over the second substrate. The first multilayered structure is cleaved along the voids to separate the first substrate, the first etch stop layer, the first semiconductor layer and a first portion of the sacrificial layer from a second portion of the sacrificial layer, the second semiconductor layer, the second multilayered structure, the insulator layer and the second substrate. The second semiconductor layer, the second portion of the sacrificial layer, and the second etch stop layer are removed to expose the device layer.

In some embodiments, a method for forming an SOI substrate is provided. The method includes following operations. A recycle substrate is received. In some embodiments, a first multilayered structure is formed on the recycle substrate. A trench is formed in the first multilayered structure. A lateral etching is performed to remove portions of sidewalls of the trench to form a recess in the first multilayered structure. The trench and the recess are sealed with an epitaxial layer, and a potential cracking interface is formed in the first multilayered structure. A second multilayered structure is formed over the first multilayered structure. In some embodiments, the second multilayered structure includes at least a device layer. A carrier substrate is received. In some embodiments, an insulator layer is formed over the carrier substrate. The device layer over the recycle substrate is bonded to the insulator layer over the carrier substrate. The first multilayered structure is cleaved along the potential cracking interface to separate the recycle substrate from the second multilayered structure, the insulator layer and the carrier substrate. The device layer is exposed.

In some embodiments, a method for forming an SOI substrate is provided. The method includes following operations. A substrate is received. A first semiconductor layer, a second semiconductor layer, a third semiconductor layer, and a fourth semiconductor layer are sequentially formed over the substrate. Portions of the second semiconductor layer, the third semiconductor layer and the fourth semiconductor layer are removed to form a plurality of mesas separated from each other by a plurality of trenches over the substrate. A lateral etching is performed to remove a portion of the third semiconductor layer, and an island is formed between the second semiconductor layer and the fourth semiconductor layer within each mesa. An epitaxial growth operation is performed to seal the trench with a semiconductor material, and a first void and a second void are formed. In some embodiments, the first void extends along a first direction and the second void extends along a second direction different from the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor-on-insulator (SOI) substrate, comprising:
    receiving a first substrate;
    forming a first multilayered structure over the first substrate, wherein the first multilayered structure comprises a first etch stop layer, a first semiconductor layer over the first etch stop layer, a second semiconductor layer over the first semiconductor layer, and a sacrificial layer between the first semiconductor layer and the second semiconductor layer;
    forming a plurality of trenches in the first multilayered structure, wherein the first semiconductor layer, the second semiconductor layer and the sacrificial layer are exposed through sidewalls of the trenches;
    performing a lateral etching to remove portions of the sacrificial layer,
    performing an epitaxial growth operation to seal the trenches with a first semiconductor material and form a plurality of voids in the first multilayered structure;
    forming a second multilayered structure over the first substrate, wherein the second multilayered structure comprises a second etch stop layer and a device layer over the second etch stop layer;
    receiving a second substrate, wherein an insulator layer is formed over the second substrate;
    bonding the device layer over the first substrate to the insulator layer over the second substrate;
    cleaving the first multilayered structure along the voids to separate the first substrate, the first etch stop layer, the first semiconductor layer, and a first portion of the sacrificial layer from a second portion of the sacrificial layer, the second semiconductor layer, the second multilayered structure, the insulator layer and the second substrate; and
    removing the second semiconductor layer, the second portion of the sacrificial layer and the second etch stop layer to expose the device layer.

2. The method of claim 1, wherein the first semiconductor layer, the second semiconductor layer and the device layer comprise the first semiconductor material.

3. The method of claim 1, wherein the first etch stop layer, the sacrificial layer and the second etch stop layer comprise the first semiconductor material and a second semiconductor material, and the second semiconductor material is different from the first semiconductor material.

4. The method of claim 3, wherein the first etch stop layer and the second etch stop layer further comprises dopants.

5. The method of claim 1, wherein a thickness of the first semiconductor layer and a thickness of the second semiconductor layer are greater than a thickness of the etch stop layer and a thickness of the sacrificial layer.

6. The method of claim 1, wherein the removing of the second semiconductor layer, the second portion of the sacrificial layer and the second etch stop layer further comprises:
removing the second semiconductor layer and the second portion of the sacrificial layer to expose the second etch stop layer by a wet etching; and
removing the second etch stop layer to expose the device layer.

7. The method of claim 1, further comprising:
removing the first portion of the sacrificial layer and the first semiconductor layer to expose the first etch stop layer by a wet etching; and
removing the first etch stop layer to expose the first substrate.

8. A method for forming an SOI substrate, comprising:
receiving a recycle substrate, wherein a first multilayered structure is formed over the recycle substrate;
forming a trench in the first multilayered structure;
performing a lateral etching to remove portions of sidewalls of the trench to form a recess in the first multilayered structure;
sealing the trench and the recess with an epitaxial layer to form a potential cracking interface in the first multilayered structure;
forming a second multilayered structure over the first multilayered structure, wherein the second multilayered structure comprises at least a device layer;
receiving a carrier substrate, wherein an insulator layer is formed over the carrier substrate;
bonding the device layer over the recycle substrate to the insulator layer over the carrier substrate;
cleaving the first multilayered structure along the potential cracking interface to separate the recycle substrate from the second multilayered structure, the insulator layer and the carrier substrate; and
exposing the device layer.

9. The method of claim 8, wherein the first multilayered structure comprises a first etch stop layer over the recycle substrate, a first semiconductor layer over the first etch stop layer, a sacrificial layer over the first semiconductor layer, and a second semiconductor layer over the sacrificial layer.

10. The method of claim 9, wherein the forming of the trench in the first multilayered structure comprises:
forming a patterned mask layer over the first multilayered structure; and
removing a portion of the second semiconductor layer, a portion of the sacrificial layer and a portion of the first semiconductor layer to form the trench through the patterned mask layer,
wherein a bottom of the trench is separated from the first etch stop layer by the first semiconductor layer.

11. The method of claim 9, wherein the performing of the lateral etching comprises laterally removing a portion of the sacrificial layer to form the recess laterally extending in the sacrificial layer.

12. The method of claim 8, wherein the second multilayered structure further comprises a second etch stop layer, and the second etch stop layer is between the device layer and the epitaxial layer.

13. The method of claim 12, wherein the exposing of the device layer further comprises:
performing a wet etching to remove the first multilayered structure and the epitaxial layer to expose the second etch stop layer; and
removing the second etch stop layer to expose the device layer.

14. The method of claim 8, further comprising performing an anneal to smooth a surface of the device layer.

15. A method for forming an SOI substrate, comprising:
receiving a substrate;
sequentially forming a first semiconductor layer, a second semiconductor layer, a third semiconductor layer, and a fourth semiconductor layer over the substrate;
removing portions of the second semiconductor layer, the third semiconductor layer and the fourth semiconductor layer to form a plurality of mesas separated from each other by a plurality of trenches over the substrate;
performing a lateral etching to remove a portion of the third semiconductor layer to form an island between the second semiconductor layer and the fourth semiconductor layer within each mesa; and
performing an epitaxial growth operation to seal the trench with a semiconductor material and form a first void extending along a first direction and a second void extending along a second direction different from the first direction.

16. The method of claim 15, wherein the first direction is perpendicular to a surface of the first substrate, and the second direction is parallel to the surface of the first substrate.

17. The method of claim 15, wherein the semiconductor material forms sidewalls, a bottom and a top of the first void.

18. The method of claim 15, wherein the semiconductor material and the third semiconductor layer form sidewalls of the second void, the second semiconductor layer forms a bottom of the second void, and the semiconductor material forms a top of the second void.

19. The method of claim 15, further comprising:
forming an etch stop layer over the substrate after the sealing of the trench; and
forming a device layer over the etch stop layer.

20. The method of claim 19, further comprising bonding the device layer to an insulator layer over a second substrate.

* * * * *